US006238454B1

(12) United States Patent
Polese et al.

(10) Patent No.: US 6,238,454 B1
(45) Date of Patent: May 29, 2001

(54) ISOTROPIC CARBON/COPPER COMPOSITES

(75) Inventors: Frank J. Polese, 4421 Granger St., San Diego, CA (US) 92126; Glen B. Engle, Poway; Vladimir Ocheretyansky, Santee, both of CA (US)

(73) Assignee: Frank J. Polese, San Diego, CA (US)

( * ) Notice: Subject to any disclaimer, the term of this patent is extended or adjusted under 35 U.S.C. 154(b) by 0 days.

(21) Appl. No.: 08/819,290

(22) Filed: Mar. 18, 1997

Related U.S. Application Data

(63) Continuation-in-part of application No. 08/654,974, filed on May 28, 1996, now Pat. No. 5,886,407, and a continuation-in-part of application No. 08/459,700, filed on Jun. 2, 1995, now abandoned, and a continuation-in-part of application No. PCT/US94/04814, filed on May 9, 1994, now abandoned, and a continuation of application No. 08/064,255, filed on May 20, 1993, now Pat. No. 5,413,751, and a continuation-in-part of application No. 08/046,635, filed on Apr. 14, 1993, now abandoned

(60) Provisional application No. 60/013,598, filed on Mar. 18, 1996.

(51) Int. Cl.$^7$ ................................ B22F 3/12; C22C 1/05; C22C 1/10; C22C 9/00

(52) U.S. Cl. ................................ 75/243; 75/247; 419/11; 419/17; 419/20; 419/23; 419/38; 419/58; 419/45

(58) Field of Search ........................ 75/243, 247; 419/11, 419/17, 20, 23, 38, 58, 45

(56) References Cited

U.S. PATENT DOCUMENTS

| 3,097,329 | * | 7/1963 | Siemens | 317/234 |
|---|---|---|---|---|
| 4,083,719 | * | 4/1978 | Arakawa et al. | 75/229 |
| 4,427,993 | * | 1/1984 | Fichot et al. | 357/81 |
| 5,086,333 | * | 2/1992 | Osada et al. | 357/67 |
| 5,413,751 | * | 5/1995 | Polese et al. | 419/23 |
| 5,686,676 | * | 11/1997 | Jech et al. | 75/247 |

* cited by examiner

*Primary Examiner*—Daniel J. Jenkins
(74) *Attorney, Agent, or Firm*—Henri J. A. Charmasson; John D. Buchaca

(57) ABSTRACT

Heat-dissipating microcircuit substrate, having coefficients of thermal expansion adjusted to match the materials of the microcircuit mounted thereupon, are manufactured by powder metallurgy using carbides resulting from the combination of various types of carbons and wetting agents.

22 Claims, 4 Drawing Sheets

ISOTROPIC CARBON/COPPER COMPOSITES

PRIOR APPLICATION

This application claims the benefit of U.S. Provisional Application No. 60/013,598, filed Mar. 18, 1996, and is a continuation-in-part of U.S. application Ser. No. 08/654,974, filed May 28, 1996, now U.S. Pat. No. 5,886,407, a continuation-in-part of U.S. application Ser. No. 08/459,700, filed Jun. 2, 1995, now abandoned, a continuation-in-part of PCT/US94/04814, filed May 9, 1994, now abandoned, a continuation of U.S. application Ser. No. 08/064,255, filed May 20, 1993, now U.S. Pat. No. 5,413,751, issued May 9, 1995, a continuation-in-part of U.S. application Ser. No. 08/046,635, filed Apr. 14, 1993, now abandoned.

FIELD OF THE INVENTION

This invention relates to powder metallurgy processing and to the fabrication of microelectronic packages and more specifically to the manufacture of a variety of heat-dissipating elements having a thermal expansivity compatible with the materials used in the fabrication of microcircuits.

BACKGROUND OF THE INVENTION

The fabrication of electronic microcircuits requires the use of substrates, heatsinks, electrodes, leads, connectors, packaging structures and other components capable of dissipating the heat generated by the active parts of the microcircuit or by the soldering, brazing or glass-sealing process. Moreover, those components that are in direct contact with the active microcircuit sections must have a thermal expansivity compatible with gallium arsenide, silicon, gallium-arsenide or any material used in the fabrication of the microcircuit.

Materials such as copper, silver, gold and aluminum which have high thermal conductivities for efficient heat dissipation also tend to have thermal expansivities much higher than materials such as gallium arsenide alumina or silicon which are used in the fabrication of microcircuit elements or their enclosures.

As disclosed in U.S. Pat. No. 4,083,719 Arakawa et al., it has been found convenient to use composites of copper and lighter materials such as carbon fibers in the manufacture of heatsinks, substrates and other heat-dissipating elements of microcircuits. The proportions of the carbon and copper in the composites are designed to match the thermal expansivity of the material used in the fabrication of the active circuit component.

The thermal expansivity of a material is defined as the ratio of the change in length per degree Celsius to the length at 0° C. The coefficient of thermal expansion (CTE) is usually given as an average value over a range of temperatures. Metals used in electrical conductors such as aluminum, copper, silver and gold have a low electrical resistivity and exhibit high thermal conductivities. Thermal conductivity is usually measured in W/m*K. Copper has a K value of 386 and silver has a value of 419. However, these metals have a thermal expansivity in excess of $15 \times 10^{-6\circ}$ $C.^{-1}$. Thus, while material of high electrical and thermal conductivity are favored in the fabrication of heat-dissipating electric elements, they must be blended with conductive materials exhibiting a much lower average thermal expansivity in order to create a composite whose thermal expansivity characteristic comes as close as practical to that of gallium arsenide, silicon and other microchip materials. A variety of carbon products having thermal expansivities in the range of 1 to $2 \times 10^{-6\circ}$ $C.^{-1}$ and thermal conductivity values in the range 100 to 600 W/m*K are considered excellent materials for controlling both thermal conductivity and thermal expansivity in the composites.

Whereas, copper, aluminum and silver have specific gravities of about 9 g/cm³ and melting points less than 1,100° C., carbon materials have specific gravities in the range 1.5 to 2.5 g/cm³ and do not melt, but sublime at temperatures above 3,000° C. Due to the large differences in the specific gravities and melting points, lack of mutual solubility and lack of wetting of the copper on carbon, it is difficult to form carbon/copper composites by conventional melting methods.

The current invention results from an attempt to devise a simple and practical process for the manufacture of such heat-dissipating components carbides by using powder metallurgy or roll-forming techniques.

In addition, as disclosed in U.S. Pat. No. 4,680,618 Kuroda et al., it has been found convenient to use composites of copper and other denser metals such as tungsten or molybdenum in the fabrication of heatsinks, substrates and other heat-dissipating elements of microcircuits. The proportions of the metals in the composite are designed to match the CTE of the material used in the fabrication of the active circuit component.

As described above, metal used in electrical conductors having a low electrical resistivity such as aluminum, copper, silver and gold also exhibit high coefficients of thermal conductivity. However, these metals also exhibit high average CTEs. Therefore, tungsten and molybdenum with average CTE of $4.6 \times 10^{-6}/°$ C. and $6 \times 10^{-6}/°$ C. and coefficient of thermal conductivity of 160 and 146 respectively are favored as conductive metal candidates for blending.

However, while copper, aluminum, and silver have specific gravities of less than 9, and melting point of less than 1,100° C., tungsten and molybdenum have specific gravities of 19.3 and 10.2, and melting points of 3,370° C. and 2,630° C. respectively.

Due to the large differences in the specific gravities and melting-points, and lack of mutual solubility of metals such as copper and tungsten, for example, it is difficult to form composites of those two metals that exhibit a reliable degree of homogeneity using conventional melting processes.

As disclosed in U.S. Pat. No. 5,086,333 Osada et al., it has been found more practical to press and sinter a powder of the most dense materials, e.g., tungsten, to form a porous compact, then to infiltrate the compact with molten copper or another lighter material. A slab of the resulting material can then be cut and machined to form heatsinks, connectors, substrates and other heat-dissipating elements.

The heat-dissipating base upon which micro-chips are mounted must also be attached to packaging or frame member usually made of ceramic or other material having a different CTE than the semiconductor material of the microchip and of the heat-dissipating base. Thermal stress between the heat-dissipating base and the frame member may cause cracks or camber after joining operation in the latter stage. The problem has been addressed in the prior art by using a intermediate heat-dissipating member whose composition and CTE continuously vary from one contact to the other as disclosed in U.S. Pat. No. 3,097,329 Siemens.

Another approach disclosed in U.S. Pat. No. 4,427,993 Fichot et al. consists of embedding a lattice of CTEmodifying material into one of the contact surfaces of the heat-dissipating element.

Both of these approaches are, complex and onerous and do not allow a precise control of the CTEs at one or both interfacing areas of the heat-dissipating member.

The costs of metals such as tungsten and molybdenum are relatively high compared to the costs of copper, aluminum and other more abundant metals. Heat-dissipating components made of composites in which a costly metal such as tungsten is used for CTE-matching purpose tend to be expensive. As the power ratings of micro-electronic modules increase, bigger heat-dissipating substrates are required. The cost associated with the substrates being dictated by the cost of their base metals remains inflexibly high while the costs of the microcircuit can be controlled and even reduced through the use of new technological improvements. The problem of substrate-related costs is particularly acute in microwave power devices where large and elaborate heat-sinks must be used. In many cases, the costs of the heat-dissipating component represent a large percentage of the total device. Accordingly, there is a need for a more economical way to construct heat-dissipating substrates for high-power micro-electric modules.

The instant invention results from an attempt to devise a simpler, more practical and more economical process to manufacture such heat-dissipating components using powder and other metallurgy techniques. The invention is based in part on the techniques and processes disclosed in the parent application, Ser. No. 08/064,255 which issued as U.S. Pat. No. 5,413,751 dated May 9, 1995, which application and patent are hereby incorporated in this Specification by reference.

SUMMARY OF THE INVENTION

The principal and secondary objects of this invention are to provide a practical and simple process to form heatsinks and other heat-dissipating elements of microcircuit devices from a composite combining a metal having a high heat coefficient of heat-dissipation and thermal expansivity with a lighter material of lower thermal expansivity, where the composite is homogeneous, has low porosity (<4%) and can be formulated to exhibit a desired thermal expansivity to match adjoining microcircuit components, while at the same time reducing or eliminating some of the machining and other finalizing steps.

It is also an object of this invention to provide a simple, practical and precise method for independently adjusting the CTEs of various surface zones of a single heat-dissipating substrate in microcircuit packages.

Another object of this invention is to reduce the cost of heat-sink substrates in power devices by combining large heat-sink elements made of inexpensive metals with smaller layers of CTE-matching composites.

These and other objectives are achieved by press-forming the desired heat-dissipating elements from composite powders of metal and carbon components and then sintering the pressed composites to achieve a homogeneous distribution of the carbon and copper throughout the structure. The composites then may be mounted on larger copper heat-sinks.

DESCRIPTION OF THE PREFERRED EMBODIMENTS OF THE INVENTION

Figure 1:
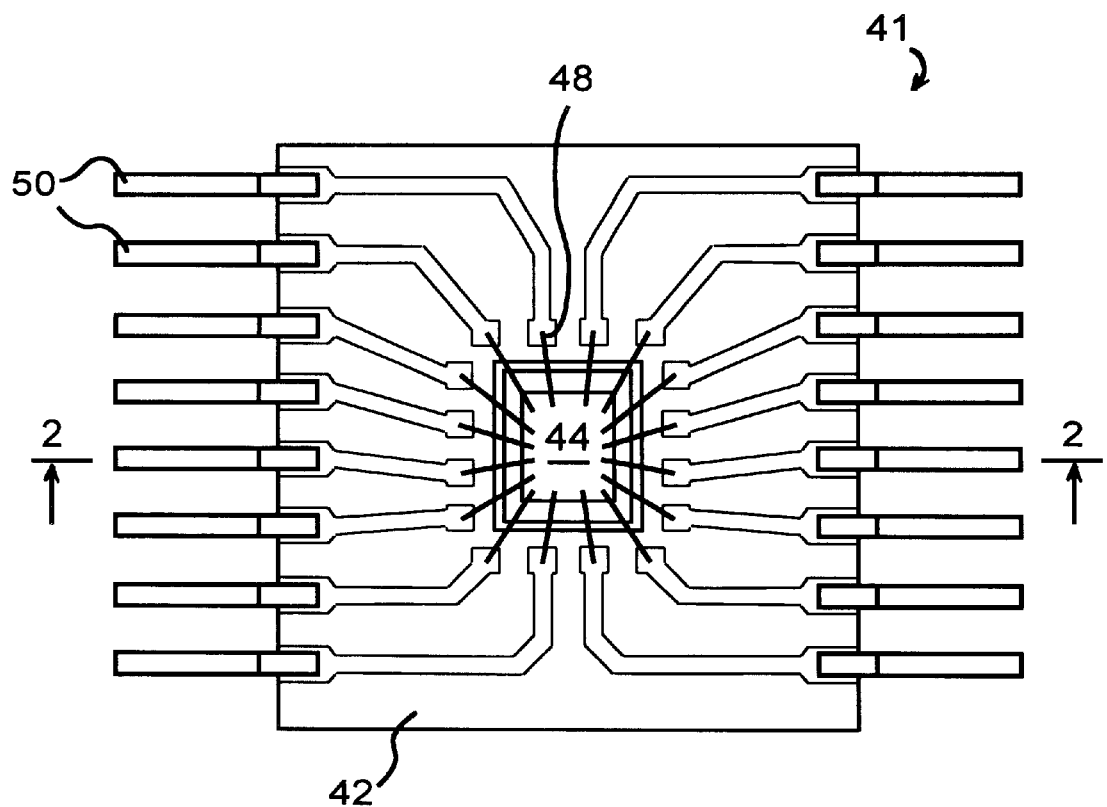
FIG. 1 is a top plan view of a microcircuit device package of the invention prior to any encapsulation.
Figure 2:
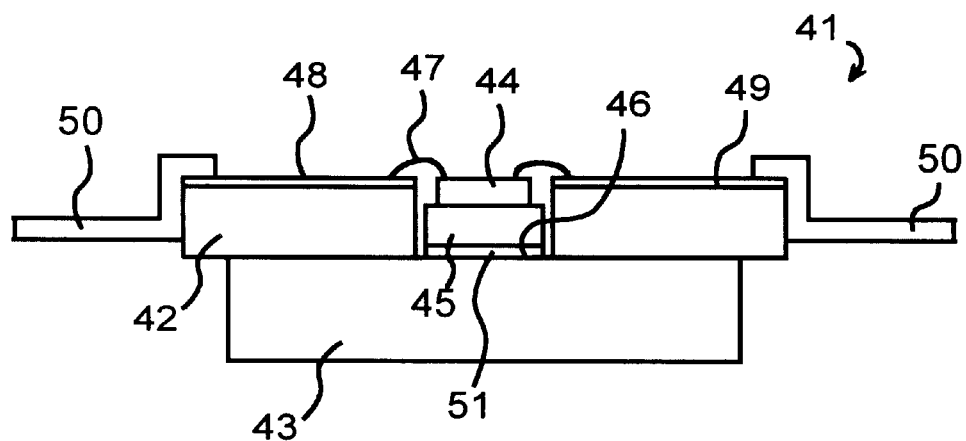
FIG. 2 is a cross-sectional view taken along line 2—2 of FIG. 1.
Figure 3:
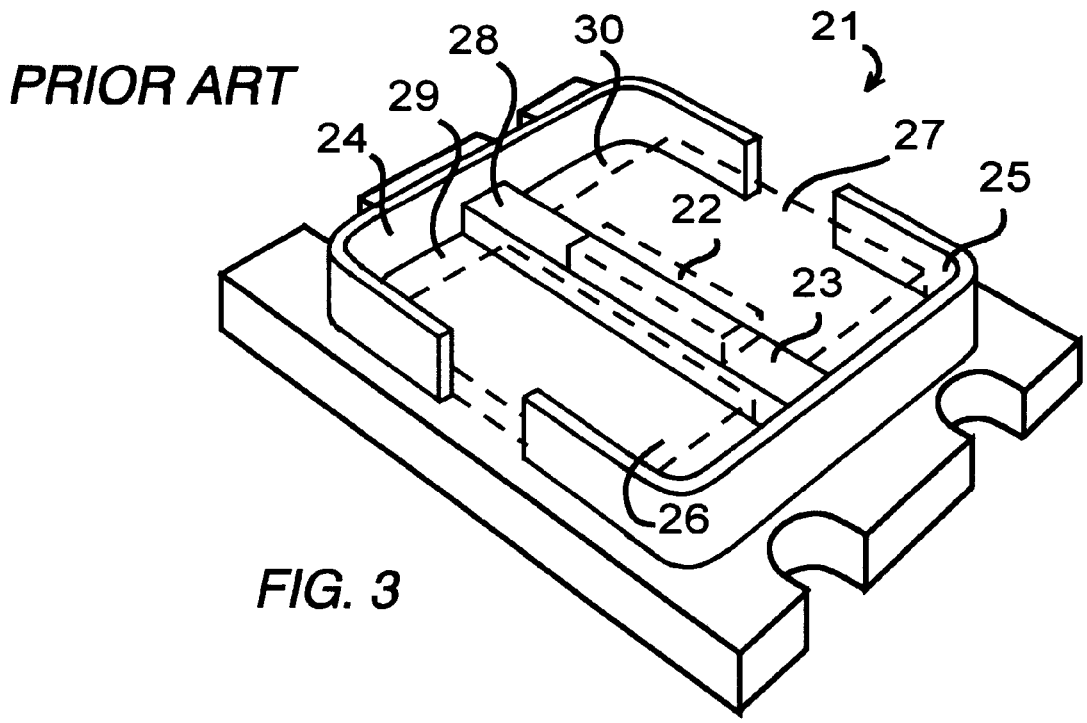
FIG. 3 is a perspective view of a microwave power device heat-sink of the prior art.

The preferred embodiment of the claimed process will be described in connection with the fabrication of heatsinks used in microelectric devices. The same process may be used in making other articles of manufacture requiring specific thermal expansivity characteristics.

The carbon/copper composite of the present invention has a linear thermal expansion coefficient below $12 \times 10^{-6}$ °C.$^{-1}$ in the range 0 to 250° C. that is not directional. When the composite of the present invention is heated at a temperature ranging from 200° C. to 800° C. permanent deformation does not occur. The copper matrix is formed by pressing a mixture of copper or copper oxide with a suitable carbon or graphite powder and sintering the pressed compact at a temperature around the melting point of copper (<1086° C.). As the proportion of the carbon particles is increased in the composite the properties of the composite becomes similar to the inherent properties of the carbon. To increase the density of the composite it is necessary to compress the powder mixture at high pressure. Both bar carbon particles and copper-coated carbon particles may be used to form the composite. An upper limit of 60 volume percent carbon is preferred.

To promote homogeneity in the composite the carbon and copper/copper oxide powders are stirred at high speed in a medium of water or alcohol.

Copper will not readily wet the carbon particles, therefore, it is necessary to add wetting agents to promote wettability. Wetting agents are primarily used to weld carbide-forms of carbon particles together to form a network upon which the copper can attach to form the composite. The wetting agents must have a low solubility in copper in order not to interfere with the thermal and electrical conductivity of the composite.

The wetting agents must form carbides in the presence of carbon to effectively bond the carbon particles and copper. The melting point of the carbides must be higher than the melting point of copper and the mechanical properties of the carbides must be greater than that of the copper in the range 200° C. to 800° C. which is the temperature range where the composites must be heated in order to braze them to microcircuit devices.

The following wetting agents will form carbides that are suitable for bonding the carbon particles into a network to accept the copper matrix: Titanium (Ti), Zirconium (Zr), Niobium (Nb), Vanadium (V), Chromium (Cr), Molybdenum (Mo) an Tungsten (W). These wetting agents may be added singularly or in combinations. These agent should be added in the range 3 to 8 volume percent of the composite.

Since the melting points of carbon and the wetting agents are higher than the melting point of copper it is desirable to promote the solid state reactions between the wetting agents and the carbon to form carbides below the melting point of copper, i.e. 1080° C. A range of 900 to a 1000° C. is desirable. A eutectic may form between the wetting agents and the copper in this range. However, the eutectic liquid will form only in thin films and readily disappear because the metals will readily react with the carbon to form high melting point carbides.

The mixing of the component powders may be done either by conventional attritive or non-attritive stirring in water or alcohol, or by the preclustering and spray-drying method disclosed in U.S. Pat. No. 5,413,751 which is incorporated herein by this reference.

The reactions described above are diffusion controlled therefore, it is desirable to have as many point or film contacts as feasible between the carbon particles, the additives and the copper. Particles less than 10 microns will provide these conditions. Compression at high pressures will further promote the solid state reactions.

The sintering of the compacts after compression is carried out in a reducing atmosphere, preferably hydrogen to prevent oxidation of the carbon and copper, and to reduce copper oxide, if used, to copper and water and suppress the formation of carbon dioxide.

In order to reduce the thermal expansivity of the composite it is necessary to incorporate carbon in the range 20 to 60 percent per volume. The following ratios of copper/carbon/wetting agents are an example of the compositions of the invention.

TABLE 1

Composition of Composite Mixtures

| Copper | | Carbon | | Wetting Agent | |
| --- | --- | --- | --- | --- | --- |
| V/o | W/o | V/o | W/o | V/o | W/o |
| 77 | 92 | 20 | 6 | 3 | 2 |
| 67 | 88 | 30 | 10 | 3 | 2 |
| 57 | 82 | 40 | 16 | 3 | 2 |
| 47 | 75 | 50 | 22 | 3 | 3 |
| 37 | 67 | 60 | 30 | 3 | 3 |

EXAMPLES OF THE INVENTION

A number of examples are given for the invention. These examples consist of a variety of copper or copper compounds mixed with a variety of carbon materials with wetting agents added. Examples are:

EXAMPLE 1. COPPER METAL POWDER, SHOT COKE AND TITANIUM METAL.

Step 1: Commercially available copper metal powder, petroleum shot coke powder and titanium powder are s used to form the composite described in this embodiment. The above-mentioned powders are comminuted to particles of less than 1 micron diameter in a suitable grinder. The fine particles of copper, shot coke an titanium are weighted to form a batch in accordance with one of the ratios shown in Table 1.

Step 2: The batch is immersed in ethyl alcohol and mixed thoroughly with a suitable mixing device. The mixed powders are then dried in an oven at 100° C. for 4 hours to evaporate the alcohol and form a cake of the mixed materials.

Step 3: The cake of materials is gently comminuted dry taking care not to separate the particles. The mixed powders are placed into a suitable die that conforms to the approximate dimensions of the article to be manufactured. The powders are compressed at room temperature at approximately 5 ksi to a thickness slightly larger than the thickness of the article to be manufactured.

Step 4: The compacted composite is placed in a suitable furnace, the furnace purged with hydrogen and heated at 800° C. for 4 hours.

Step 5: The composite is machined to the dimensions required and the surfaces, ends and slides made flat and parallel.

Step 6: The composite are tested for hermiticity using a differential helium pressure. After verifying that the composite is gas tight, it is coated with nickel to complete the manufacturing process.

2. Example 1 except the wetting agent is zirconium.

3. Example 1 except the wetting agent is chromium.

4. Example 1 except the wetting agent is niobium.

5. Example 1 except the wetting agent is molybdenum.

6. Example 1 except the wetting agent is vanadium.

7. Example 1 except the wetting agent is tungsten.

8. Examples 1 through 7 except the materials are mixed in alcohol and dried prior to pressing.

9. Example 8 except the materials are mixed in water and dried prior to pressing.

10. Examples 1 through 9 except the petroleum coke is isotropic.

11. Examples 1 through 9 except the carbon powder is natural flake graphite.

12. Examples 1 through 9 except the carbon is in the form of petroleum pitch derived graphite fibers.

EXAMPLE 13. COPPER OXIDE POWDER, SHOT COKE AND TITANIUM METAL.

Step 1: Commercially available copper oxide powder, petroleum shot coke powder and titanium powder are used to form the composite described in this embodiment. The above-mentioned powders are comminuted to particles of less than 1 micron diameter in a suitable grinder. The fine particles of copper, shot coke and titanium are weighted for form a batch in accordance with one of the ratios shown in Table 1.

Step 2: The five batch is immersed ethyl alcohol and mixed thoroughly with a suitable mixing device. The mixed powders are then dried in an oven at 100° C. for 4 hours to evaporate the alcohol and form a cake of the mixed materials.

Step 3: The cake of materials is then gently comminuted dry taking care not to segregate the particles. The mixed powders are placed into a suitable die that conforms to the approximate dimensions of the article to be manufactured. The powders are then compressed at room temperature at approximately 5 ksi to a thickness slightly larger than the thickness of the article to be manufactured.

Step 4: The compacted composite is placed in a suitable furnace, the furnace purged with hydrogen and heated at 800° C. for 4 hours to produce a solid composite of copper/carbon/titanium carbide.

Step 5: The composite is machined to the dimensions required and the surfaces, ends and sides made flat and parallel.

Step 6: The composite is tested for hermiticity using a differential helium pressure. After verifying that the composite is gas tight, it is coated with nickel to complete the manufacturing process.

14. Examples 1 through 12 except the copper is added as salt.

15. EXAMPLE 15: COPPER METAL, COOPER COATED SHOT COKE AND TITANIUM METAL.

Step 1: Commercially available copper-coated petroleum shot coke and titanium powder were used to form the composite described in this embodiment. The shot coke and the titanium metal powders are comminuted to particles of less than 1 micron diameter in a suitable grinder. The shot coke is coated with a layer of copper that is equivalent to one of the ratios of copper, shot coke and titanium described in Example 1. A batch of copper-coated shot coke and titanium metal is prepared.

Step 2: The batch is immersed in ethyl alcohol and mixed thoroughly with a suitable mixing device. The mixed powders are dried in an oven at 100° C. for 4 hours to evaporate the alcohol and form a cake of the mixed material.

Step 3: The cake of materials is then gently comminuted dry taking care not to separate the particles. The mixed powders are placed into a suitable die that conforms to the approximate dimensions of the article to be manufactured. The powders are compressed at room temperature at approximately 5 ksi to a thickness slightly larger than the thickness of the article to be manufactured.

Step 4: The compacted composite is placed in a suitable furnace, the furnace purged with hydrogen and heated at 800° C. for 4 hours.

Step 5: The composite is machined to the dimensions required and the surfaces, ends and sides made flat and parallel.

Step 6: The composite is tested for hermiticity using a differential helium pressure. After verifying that the composite is gas tight it is coated with nickel to complete the manufacturing process.

16. Examples 1 through 15 except the dry mixture or the dried mixture is hot pressed at 1500 psi at 800° C. for 4 hours.

Ingots or billet resulting from the above-samples are machined to near net dimension and may or may not be coated with a thin layer of copper to seal the surface. The resulting articles are then polished to the exact dimensions required for the application.

Another embodiment of the invention will be described in connection with the fabrication of heatsinks used in microelectronic devices. The same process may be used in making other articles of manufacture requiring a combination of metals of substantially different specific gravities and/or melting temperatures.

The term "high thermal conductivity" is meant to include those materials that have a coefficient of thermal conductivity in excess of 150.

Similarly, with respect to coefficients of thermal expansion, those materials having a CTE below approximately $10 \times 10^{-6}/°$ C. will be said to have a "low" CTE. Those materials having a CTE above approximately $12 \times 10^{-6}/°$ C. will be said to have a "high" CTE.

A mixture of particles of at least one material, composite or alloy having an average coefficient of thermal conductivity above 200, and at least one second material, composite or alloy having an average coefficient of thermal expansion of less than $7 \times 10^{-6}/°$ C. is press-molded at room temperature into compacts in the shape of the desired heatsinks using a pressure that does not exceed 6,804 atmospheres (100,000 psi).

The first material, composite or alloy is preferably selected from a group consisting of aluminum, copper, tin, lead, germanium, gold and silver, and composites and alloys thereof. The second metal composite or alloy is preferably selected from a group consisting of tungsten, molybdenum and carbon, and composites and alloys thereof.

Particles of other metals such as cobalt and nickel can also be added to the mixture to achieve particular CTE and other desired characteristics.

The metal particles may have been formed by techniques well-known to those skilled in powder metallurgy, such as by chemical reduction of the oxide form of the metal. It has been found that the homogeneity of the final composite may be improved by using a free-flowing powder mixture of pre-clustered particles of the different density metals. Free-flowing powder refers to those powders which flow unaided through a Hall flow-meter funnel having an orifice of 2.54 millimeters (0.1 inch) as specified under standards published by the Metal Powder Industries Federation (MPIF). Such pre-clustering may be accomplished by using spray-dry powders. Pre-clustered mixtures may be obtained through other methods resulting in a temporary bond between particles of different densities. The bond must be relatively weak so as to be broken under the pressure applied to the press-mold in order to form a more homogeneous compact having pore sizes comparable with particle sizes.

The compacts are then placed in a furnace and sintered at a temperature sufficient to melt the material having the lowest melting point and the lowest specific gravity. As the particles of the latter, typically copper, melt, the fluid metal phase forms a film surrounding the solid phase, typically the tungsten or molybdenum particles, providing a good wetting condition. The formation of the melted metal liquid film and the use of fine particles of tungsten, molybdenum or carbon enhance the surface tension that acts as the principal mechanism yielding a higher densification and pore reduction. Nearly equivalent results can be achieved by not allowing the particles of metal having the lowest melting point to melt completely but to soften enough to deform and adhere to the other particles. The sintering of the described compacts shows a shrinkage of about 15% that characterizes the above-described fabrication of final composite blocks having the shape of the desired heatsinks without need of any extensive cutting, stamping or machining. Therefore, the process results in a readily usable, inexpensive component having good thermal conductivity and matched thermal expansion characteristics.

EXAMPLE

A copper and tungsten powder was selected that contained approximately 15 percent copper and 85 percent tungsten by weight (27.7 percent and 72.3 per volume). The powder mixture consisted of metal particles with average diameter of less than 2 microns in diameter. The mixture had been spray-dried and treated to form homogeneous and lightly-bound agglomerates of tungsten and copper particles in nodules with an average diameter of 200 microns. Such a powder mixture is manufactured by Sylvania of Towanda, Pa. according to the inventors' specifications disclosed herein.

The mixture was press-molded at room temperature under 3,740 atmospheres (55,000 lbs/in$^2$) into the final 1.9 cms×1.9 cms×0.20 cms shapes of the desired heatsinks for microelectronic assemblies. The resulting "green" compacts were placed in a sintering furnace and subjected to a temperature of 1,100° C. to 1,350° C. for one hundred twenty minutes.

After cooling, the final articles exhibited a specific gravity of 16.15, as compared to the 16.41 gravity that would result from a perfectly solid composite, i.e., slightly over 98% of theoretical density of a similarly proportioned alloy.

Observation under 1,000×magnification of the products manufactured according to this example, and similar products manufactured by press-molding of the tungsten powder alone and subsequent infiltration by melted copper shows that the invention resulted in substantially finer distribution of the copper, improved homogeneity, and lower porosity of the final material.

Other compositions with tungsten to copper ratios of 80/20 through 90/10 were similarly fabricated that exhibited coefficients of thermal expansion ranging from 6.5 to 8.0× $10^{-6}/°$ C. sufficient to match the thermal expansion coefficient of gallium arsenide, $Al_2O_3$ and other materials used in the fabrication of microelectronic packages, while retaining coefficient of thermal conductivity between 140 and 200 W/m° K.

An application of the above-described sintering process to the manufacture of heat-dissipating substrate elements in microcircuit devices will now be described with reference to the drawing.

A the microcircuit device 41 comprises an electrical interconnect support structure 42 made of layers of relatively inexpensive dielectric material such as polyamid or other polymer dielectrics, or epoxy having a high CTE. The support structure supports a heat-dissipating substrate or base 43 made of relatively inexpensive materials having a high overall thermal conductivity coefficient and a high CTE, such as copper or aluminum. Other inexpensive materials having a low thermal conductivity but relatively high CTE such as FR4 epoxy may also be suitable for the support structure.

A micro-chip or die 44 is supported by a pedestal 45 rising from the upper surface 46 of the substrate 43. The pedestal 45 is manufactured separately from the substrate 43 then bonded to the substrate either by brazing, resistance welding, ultrasonic welding, pressing, i.e., cold diffusion under high pressure, or, with a use of an interim layer 51 of thermally conductive polymer adhesive containing metal particles. Alternatively, the interim layer can be a sheet of copper, aluminum, silver, gold or any alloy of those metals no thicker than 500 microns, not including distortion that may be caused by the brazing or welding process, inserted between the pedestal 45 and the substrate. This sheet can either be brazed, welded or bonded by adhesive to the substrate 43, to the pedestal 45, or to both.

A series of wire-bonds 47 connect contact points on the die to metalization 48 patterned onto the surface 49 or within the body of the support structure 42. The metalization connects to a plurality of leads 50 extending from the structure 42.

In order to distribute and reduce the mechanical stress at the junction of the various components of the device, the components are made of materials having CTEs which are compatible with the CTEs of materials used in adjacent contacting components. Accordingly, the bulk of the substrate 43 has a CTE comparable with the CTE of the dielectric support structure 42, while the pedestal 45 has a CTE chosen or adjusted according to the above described process, to be substantially thermally compatible with the semiconductor material of the chip 44 it contacts and supports.

It should be understood that the CTEs of two adjacent components do not have to be matched exactly, but need only to be substantially compatible or close enough to avoid camber or fracture or separation of the layers due to the respective expansion of the components over a change of temperature range of approximately 250° C., typically from −55° C. to 200° C. For example, the 24 CTE of an aluminum substrate 43 is thermally compatible with the 24 CTE of a polyamid or epoxy support structure 42. The CTE of the pedestal 45 is adjusted to be thermally compatible with the 4.2 CTE of the silicon used in the die 44. Adjustment of the pedestal CTE can be accomplished by selecting a material such as tungsten-copper with a 6.0 CTE. Other candidates for the pedestal material are molybdenum-copper, graphite-copper, graphite-aluminum, aluminum silicon carbide or composites thereof, or other low expansion, high thermal conductivity material.

The embodiment of the invention described below is intended to yield a low cost heat-dissipating substrate for use in power micro-electronic devices such as microwave amplifiers. A typical prior art heat-sink 21 used in connection with a microwave power amplifier is cast or machined from a composite typically manufactured by powder metallurgy process. The microcircuit elements shown in dotted line comprise a power amplifier 22 mounted on a rib 23 spanning the center of the heat-sink. The rib divides the upper surface of the heat-sink into two cavities 24, 25 which are shaped and dimensioned to nest an input receiver 26 and an output transmitter 27 respectively. The amplifier 22 is typically a gallium-arsenide (GaAs) Field Effect Transistor mounted directly on the upper surface 28 of the rib 23 for maximum heat-dissipation. The input and output modules 26, 27 are typically hybrid microcircuits having their bottom surface bonded to the floors 29, 30 of the cavities 24, 25. The composite material of the heat-sink has a CTE which has been adjusted by appropriate apportionment of its powder components to substantially match the CTE of the GaAs in the amplifier 22. The composite typically includes tungsten, molybdenum and other relatively costly metals.

Figure 4:
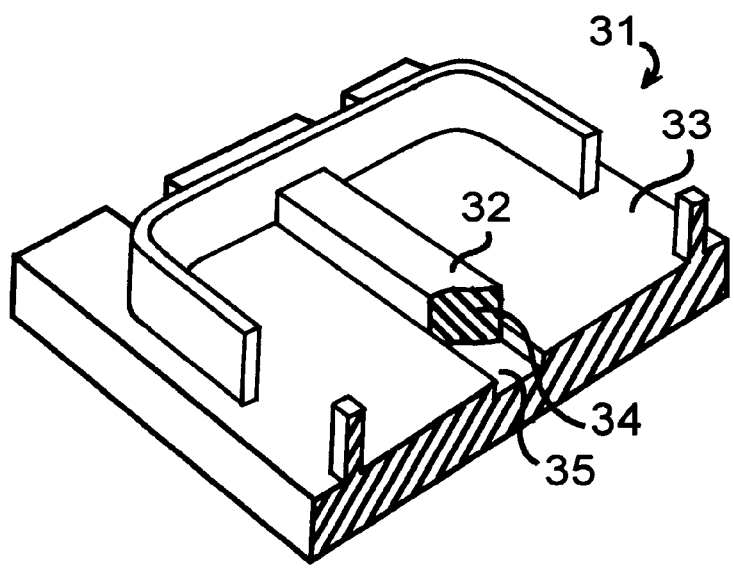
FIG. 4 is a median cross-sectional view of an improved heat-sink according to the invention.

In the similar, but improved heat-sink 31 illustrated in FIG. 4, only the amplifier-supporting rib or pedestal 32 is cast or machined from a CTE-matching composite while a slab 33 corresponding to the bulk of the heat-sink 31 is made from a more abundant material such as copper or aluminum or an alloy thereof having a very high heat-transfer characteristic.

Preferably, the amplifier-supporting rib or pedestal 32 has its lower portion 34 nested into a slot 35 formed into the upper surface of the copper or aluminum slab 33.

The bonding between the pedestal 32 and the slab 33 is preferably done by welding, brazing or in accordance with one of the bonding techniques disclosed in connection with the earlier described embodiments of the invention. The bond must be able to withstand temperatures of 150 degrees Celsius (approximately 300 degrees F.) which can be generated in this type of power devices. Accordingly, any brazing material, solder or adhesive must have a melting temperature in excess of 180 degrees Celsius (approximately 350 degrees F.). This technique of using a relatively expensive CTE-matching composite pedestal on the portion of the heat-sink in direct contact with the transistor or other microcircuit elements from which heat has to be drained, can be applied to laser diodes and other high power components.

Due to the small amount of CTE-matching material used in forming the pedestal, relatively expensive materials such as composites formed by powder-metallurgy techniques are available, such as combinations of copper or aluminum, with tungsten, molybdenum, or graphite. This also allows the use of diamond, diamond composites or other expensive materials with a very high heat-transfer capability to be used more economically.

It should be noted that if resistance welding is used to bond the rib to the slab, there may be some deformation of the rib-to-slab interface and some metal splattering on adjacent surfaces. The splatter and deformation may be removed by machining the heat-sink after welding is completed. This, of course, may require minor modification of the structures to accommodate the removal of material during later machining.

Figure 5:
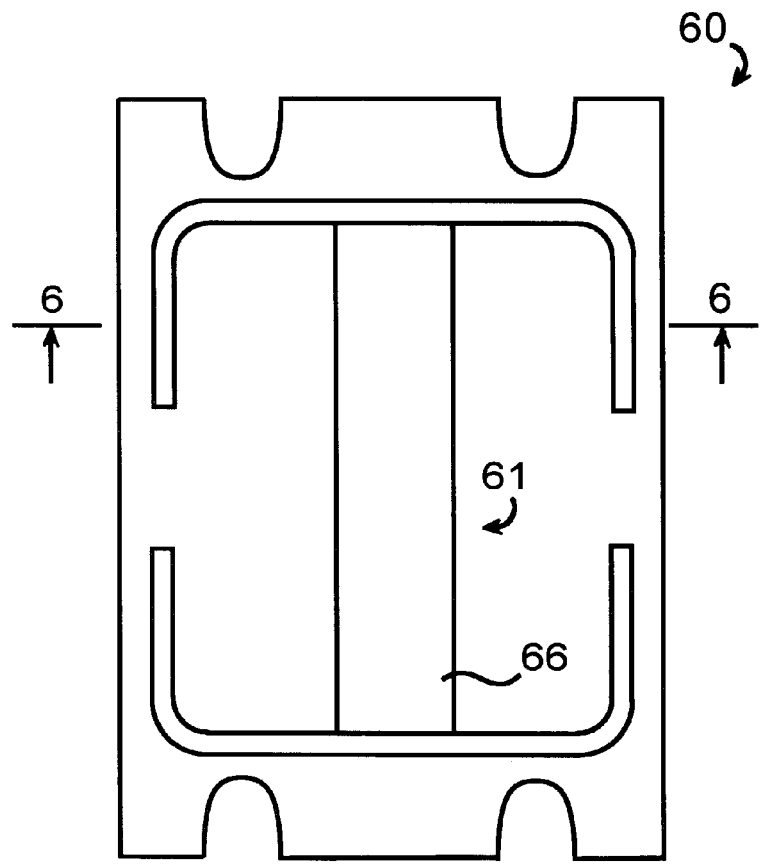
FIG. 5 is a top plan view of a microwave power device heat-dissipating package according to another embodiment of the invention.
Figure 6:
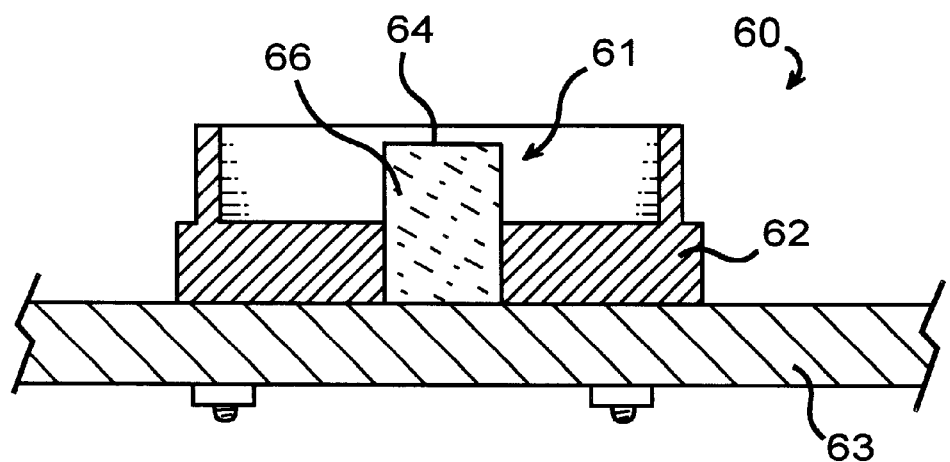
FIG. 6 is a cross-sectional view taken along line 6—6 of the package of FIG. 5 as attached to a support housing.

In an alternate embodiment 60 of the power microcircuit heat-dissipating package, shown in FIGS. 5–6, a high thermal conductivity amplifier-supporting pedestal 61 extends through the slab 62 to contact the housing 63 to which the heat-sink is attached during operation. This arrangement is particularly suited to applications involving particularly high heat producing chips or those requiring especially efficient heat conductivity.

As in the previous embodiment, the pedestal 61 is formed from materials such that its upper surface 64 has a CTE substantially matching that of the mounting surface of the amplifier.

For example, for a GaAs amplifier, the pedestal 61 is made of high thermal conductivity, low expansion material such as diamond, graphite, or other high thermal conductivity carbon, or a graphite-metal composite, such as graphite-aluminum or graphite-copper, or aluminum-silicon carbide type material. The slab 62 is made from relatively less expensive low expansion material such as copper-tungsten, copper-molybdenum or a graphite-metal composite.

By extending the pedestal 61 through the slab 62, heat is transferred more directly to the high heat capacity housing 63 rather than through the slab. Indeed, full advantage is not taken of the high conductivity of a pedestal made from diamond when heat must first transfer to a less heat conductive or heat capacitive slab.

Figure 7:
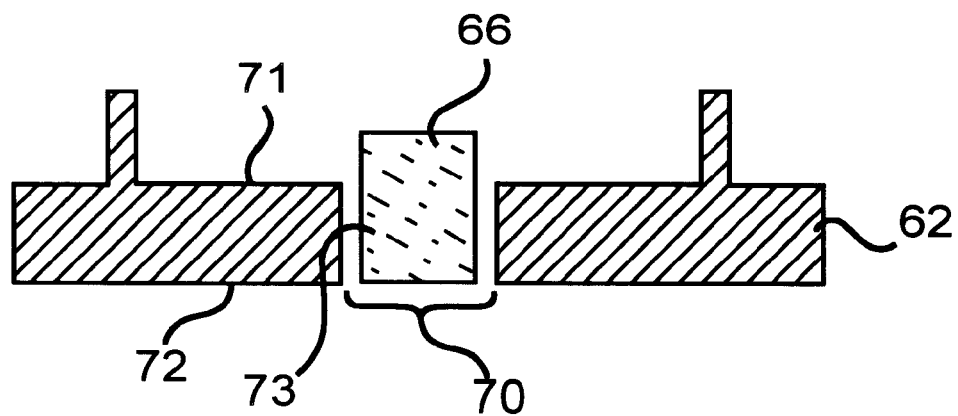
FIG. 7 is a cross sectional end view of an in-process microwave power device heat-dissipating package according to an embodiment of the invention prior to sintering.
Figure 8:
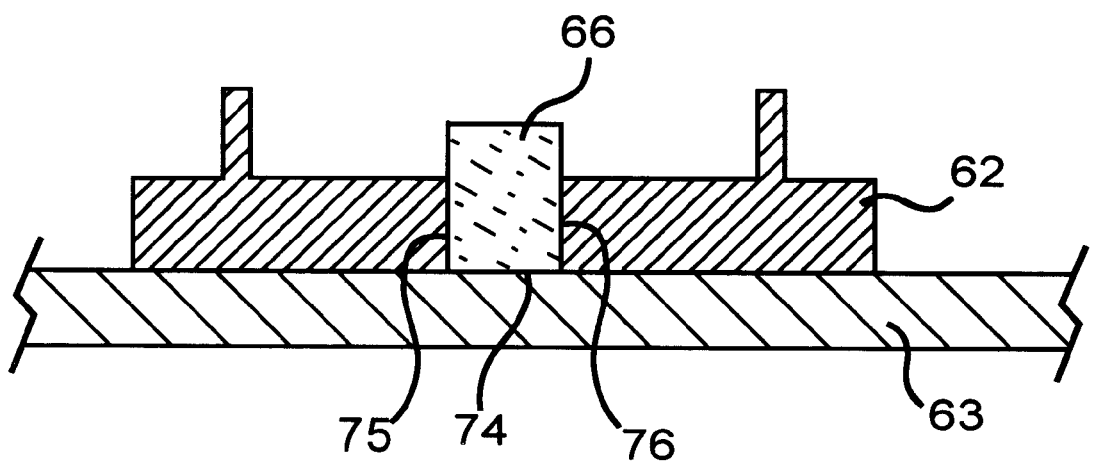
FIG. 8 is the package of FIG. 7 after sintering.

Referring now to FIGS. 7–8, an alternate embodiment of the process for manufacturing the power microelectronic device heat-sink is shown. The heat-sink slab is manufactured according to the above described powdered metallurgical process wherein sintering causes a shrinkage in the slab. In its pre-sintered state, as shown in FIG. 7, the slab 62 has a central aperture 70 extending from an upper surface 71 of the slab to a bottom surface 72 of the slab. The aperture is sized to allow for the insertion of a portion 73 of the pedestal 66 into the aperture. If the pedestal 66 is metalized it may be bonded to the slab 62 by sintering the slab while the pedestal is engaged in the aperture 70. The sintering causes the compact material comprising the slab to shrink, thereby reducing the size of the aperture to the point where in contacts the walls 75,76 of the portion of the pedestal engaged within the aperture, thereby hermetically bonding the pedestal in place.

The pedestal is positioned within the aperture such that a lower surface 74 is exposed for contact to the heat capacitive mounting housing 63.

While the preferred embodiments of the invention has been described, modifications can be made and other embodiments may be devised without departing from the spirit of the invention and the scope of the appended claims.

We claim:

1. A substantially homogeneous heat-dissipating carbon composite for packaging a microcircuit component, said composite comprising:

a concentration of copper;

a concentration of carbon consisting essentially of carbon particles comminuted to a diameter of no more than 10 microns;

a concentration of a wetting agent;

wherein said concentrations are adjusted such that said composite has a thermal expansivity substantially matching a thermal expansivity of said microcircuit;

whereby differences in expansions of the microcircuit component and its packaging are sufficiently minimized to avoid separation under operating conditions.

2. The composite of claim 1, wherein said composite has a non-directional thermal expansion coefficient of less than $12 \times 10^{-6}$/degrees centigrade in the range from 0 to 250 degrees centigrade.

3. The composite of claim 1, wherein said composite has a porosity of less than about 4%.

4. The composite of claim 1, wherein the concentration of said carbon is between about 20 and about 60 volume percent of said composite.

5. The composite of claim 1, wherein the concentration of said wetting agent is between about 3 and about 8 volume percent of said composite.

6. The composite of claim 1, wherein said wetting agent comprises:

a first metal capable of forming a carbide at a temperature less than 1,080 degrees centigrade.

7. The composite of claim 1, wherein said wetting agent comprises:

a first metal capable of forming a carbide at a temperature between about 900 degrees centigrade and about 1,000 degrees centigrade.

8. The composite of claim 6, wherein said first metal is selected from the group consisting of:

titanium, zirconium, niobium, vanadium, chromium, molybdenum, and tungsten.

9. A process for making a substantially homogeneous heat-dissipating composite having a thermal expansivity compatible with a microcircuit component, said process comprising:

mixing a first concentration of particles comprising carbon, a second concentration of particles comprising copper, and a concentration of particles of a wetting agent into a mixture;

drying said mixture to a cake state;

comminuting said dried mixture to a powder;

compacting said powder to form a compact; and sintering said compact in a reducing atmosphere.

10. The process of claim 9, which further comprises:

immersing said particles in ethyl alcohol prior to said mixing step; and drying said mixture to evaporate said alcohol.

11. The process of claim 9, wherein said composite has a non-directional thermal expansion coefficient of less than $12 \times 10^{-6}$/degrees centigrade in the range from 0 to 250 degrees centigrade.

12. The process of claim 9, wherein said composite has a porosity of less than about 4%.

13. The process of claim 9, wherein said composite is between about 20 and about 60 volume percent carbon.

14. The process of claim 9, wherein the concentration of said wetting agent is between about 3 and about 8 volume percent of said composite.

15. The process of claim 9, wherein each of said particles comprising carbon has a largest dimension of less than about 10 microns.

16. The process of claim 9, wherein said wetting agent comprises:

a first metal capable of forming a carbide at a temperature less than 1,080 degrees centigrade.

17. The process of claim 9, wherein said wetting agent comprises:
  a first metal capable of forming a carbide at a temperature between about 900 degrees centigrade and about 1,000 degrees centigrade.

18. The process of claim 16, wherein said first metal is selected from the group consisting of:
  titanium, zirconium, niobium, vanadium, chromium, molybdenum, and tungsten.

19. The process of claim 9, wherein said particles comprising carbon are petroleum shot coke particles having a diameter of no more than 1 micron.

20. The process of claim 9, wherein said particles comprising copper are copper oxide particles.

21. The process of claim 10, wherein said particles comprising carbon are petroleum shot coke particles having a diameter of no more than 1 micron.

22. The process for making a substantially homogeneous heat-dissipating composite having a thermal expansivity compatible with a microcircuit component, said process comprising:

forming bonds between a concentration of carbon particles having a diameter of no more than 10 microns and a concentraion of copper particles, thereby resulting in a number of bonded particles;

mixing said bonded particles, and a concentration of particles of a wetting agent into a mixture;

compacting said mixture at a pressure sufficient to break a number of bonds, thereby forming a compact; and sintering said compact in a reducing atmosphere.

* * * * *